United States Patent [19]

Urbish et al.

[11] Patent Number: 4,939,792
[45] Date of Patent: Jul. 3, 1990

[54] MOLDABLE/FOLDABLE RADIO HOUSING

[75] Inventors: Glenn F. Urbish, Coral Springs; John M. McKee, Coral Springs; Martin J. McKinley, Sunrise; Anthony B. Suppelsa, Coral Springs, all of Fla.

[73] Assignee: Motorola, Inc., Schaumburg, Ill.

[21] Appl. No.: 121,323

[22] Filed: Nov. 16, 1987

[51] Int. Cl.$^5$ .............................................. H04B 1/08
[52] U.S. Cl. ..................................... 455/347; 455/351; 343/702; 361/415; 361/422
[58] Field of Search ..................... 455/351, 346–348, 455/89, 90; 343/702; 361/412, 415, 422, 397–399, 331, 380; 364/708

[56] References Cited

U.S. PATENT DOCUMENTS

| | | | |
|---|---|---|---|
| 4,126,863 | 11/1978 | Kolwaite | 455/351 X |
| 4,394,707 | 7/1983 | Consoli | 361/399 X |
| 4,558,427 | 12/1985 | Takeuchi et al. | 364/708 |
| 4,651,312 | 3/1987 | Honma et al. | 455/351 X |
| 4,719,322 | 1/1988 | Guzik et al. | 455/351 X |
| 4,727,410 | 2/1988 | Higgins, III | 361/412 X |
| 4,742,183 | 5/1988 | Soloway et al. | 361/412 X |

FOREIGN PATENT DOCUMENTS

| | | | |
|---|---|---|---|
| 59-86925 | 5/1984 | Japan | 455/347 |
| 61-89724 | 5/1986 | Japan | 455/351 |

Primary Examiner—Douglas W. Olms
Assistant Examiner—Ralph Smith
Attorney, Agent, or Firm—Daniel K. Nichols

[57] ABSTRACT

A molded thermoplastic housing (100) includes base (102) and cover (104) members joined by a living hinge (106). The base member (102) includes a peripheral wall (108). Four solderable printed circuit patterns (112, 114, 116 and 118) are vacuum deposited onto the interior and exterior surfaces of both housing members. The printed circuit patterns on opposing surfaces of the base and cover members are joined by conductive through-holes (e.g., 120 and 122), while the printed circuit patterns on the interior surfaces of the base and cover members are joined by an interconnecting printed circuit pattern (124) which is vacuum deposited onto the living hinge. Mylar sheets (132) are adhered to the exterior surface of the housing to insulate the exterior printed circuit patterns. An antenna pattern (126) is also vacuum deposited onto an exterior surface of the housing. A switch (136) and battery contact (152) are integrally formed with the housing and an integrally molded structural support means strenghthens the housing members. The housing is manufactured "opened up" and, at the final assembly stage, the cover member is rotated about the hinge until it contacts the upper surface of the peripheral wall (108B). Snap-fit connectors (e.g., 110) join the cover to the base.

13 Claims, 3 Drawing Sheets

MOLDABLE/FOLDABLE RADIO HOUSING

BACKGROUND OF THE INVENTION

This invention pertains to housings for electronic devices, and more particularly, to a molded housing for a radio receiver that includes printed circuit patterns directly disposed on the surface of the housing.

The typical prior art housing for an electronic device comprises a multiplicity of parts. These parts may be manufactured at different locations by different manufacturers using a variety of processes and materials. These parts are then shipped to a point of final assembly, assembled, tested and shipped to their next destination.

There are several disadvantages to the prior art housing. First, the large number of individual parts, and the variety of manufacturing processes and materials necessary to manufacture these parts elevates manufacturing costs. Since the parts must be assembled, and the assembly process is usually labor or machine intensive, final assembly represents a significant percentage of total manufacturing costs. The large number of individual parts also creates reliability, quality control and inventory problems.

Accordingly, it would be advantageous of a housing could be developed that reduced the total number of individual parts and processes necessary for its manufacture. The housing described below accomplishes this objective.

SUMMARY of the INVENTION

Briefly, the invention is a moldable and foldable housing for an electronic device. The housing includes first and second housing members joined by a hinge. The housing members and the hinge are integrally molded. A solderable printed circuit pattern is disposed directly on a surface of the first housing member.

DESCRIPTION OF THE PREFERRED EMBODIMENT

Figure 1:
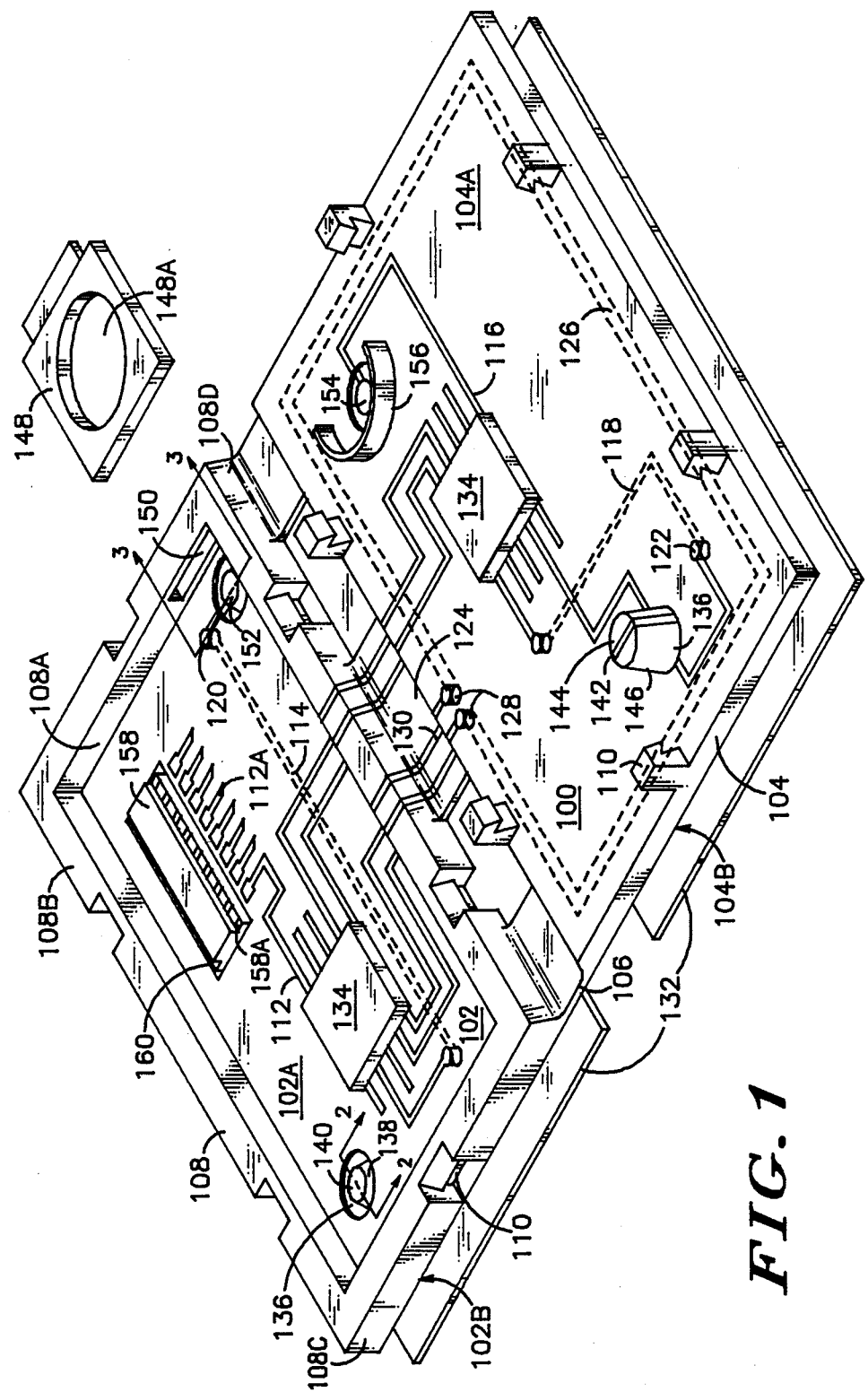
FIG. 1 is a perspective view of the preferred moldable/foldable radio housing. The housing is illustrated "opened up" wherein the cover has been rotated 180 degrees about the connecting hinge, such that the interior surface of the housing cover faces up in the figure.

Referring to FIG. 1, a moldable/foldable housing 100 includes a base member 102, a cover member 104, and a living hinge 106 joining the base and cover members. Base member 102 has opposing interior and exterior surfaces 102A and B and, similarly, cover member 104 has opposing interior and exterior surfaces 104A and B (the interior surfaces face "up" in FIG. 1 and only the edges of exterior surfaces 102B and 104B are visible in the figure). Base member 102 includes a peripheral wall 108 which extends around the perimeter of the base. Peripheral wall 108 has interior, upper and exterior surfaces 108A-C, respectively. The exterior surface 108D of the peripheral wall adjacent hinge 106, and the interior surfaces 108A are sloped at an angle relative to interior surface 102A, preferably 70 degrees. These sloping surfaces 108A and D facilitate the depositing of the printed circuit patterns described below.

Housing 100 is illustrated unassembled in FIG. 1. To complete the assembly, cover 104 is rotated about hinge 106 until the interior surface 104A of the cover contacts the upper surface 108B of the peripheral wall. Snap-fit connectors, e.g. 110, are preferably integrally molded with housing 100 and provide a means for fastening cover 104 to base 102. For certain applications, for example, when housing 100 is extremely thin, it may be preferable to eliminate the snap-fit connectors and ultrasonically weld cover 104 to upper surface 108B. Other well known shapes of snap-fit connectors may also be suitable and other fastening means, for example, screws, could also be used to fasten cover 104 to base 102.

Housing 100 is preferably injection molded from a thermoplastic material, preferably polyetherimide (PEI). Other thermoplastic materials may also be suitable, although high temperature thermoplastic materials are preferred because the housing is usually exposed to soldering temperatures. Examples of suitable high temperature thermoplastic materials include polysulfone, polyethersulfone, polyamideimide, polyarylsulfone, polyarylate, polyetheretherketone, polybutyleneterephthalate, and blended combinations thereof. It is preferred that all housing parts, including base 102, cover 104, hinge 106, peripheral wall 108, snap-fit connectors 110, and the switch 136 and battery contact 152 described below, be injection molded from the same mold (i.e., integrally molded). If there are no printed circuit patterns on cover 104, however, hinge 106 could be eliminated and the cover manufactured separately from the base. The manufacture of a living hinge is well known in the art of injection molded plastics.

Solderable printed circuit patterns 112 and 114 are respectively disposed directly on interior 102A and exterior 102B surfaces of the base, and similarly, solderable printed circuit patterns 116 and 118 are respectively disposed directly on the interior 104A and exterior 104B surfaces of the cover. Conductive through-holes interconnect opposing printed circuit patterns. For example, conductive through-hole 120 is electrically connected between printed circuit patterns 112 and 114, and through-hole 122 is electrically connected between printed circuit patterns 116 and 118. An interconnecting printed circuit pattern 124 is disposed directly on hinge 106 and is electrically connected between printed circuit patterns 112 and 116. A printed circuit loop antenna pattern is directly disposed on the exterior surface 104B of the cover. Conductive through-holes 128 and another interconnecting printed circuit pattern 130 disposed on hinge 106 provide a means to connect antenna 126 to printed circuit pattern 112. To protect the external printed circuit patterns 114 and 116, including antenna pattern 126, thin sheets of mylar or other insulative material 132 are adhesively bonded over the printed circuit patterns.

All printed circuit patterns are preferably vacuum deposited onto the various surfaces of housing 100, as described in a co-pending application entitled, "High Temperature Thermoplastic Substrate Having A Vacuum Deposited Solderable Electrical Circuit Pattern and Method of Manufacture" that was filed on the same date as the present application and which is wholly incorporated by a reference herein. Since housing 100 is three dimensional, the photolithographic definition of the printed circuit patterns is accomplished as described in another co-pending application entitled, "Photoimaged Three Dimensional Printed Circuit Substrate and Method of Manufacture" that was also filed on the same date as the present application and which is wholly incorporated by a reference herein. It is preferred that the printed circuit patterns be directly disposed (i.e., without any intervening structure between the printed circuit conductor and the housing, such as a layer of adhesive, or a conventional rigid or flexible printed circuit board) on the housing surfaces, and other methods of depositing printed circuit patterns directly onto a molded thermoplastic substrate, such as electroless plating, are also suitable. Electrical components, for example 134, are soldered directly to the interior printed circuit patterns 112 and 116.

Figure 2:
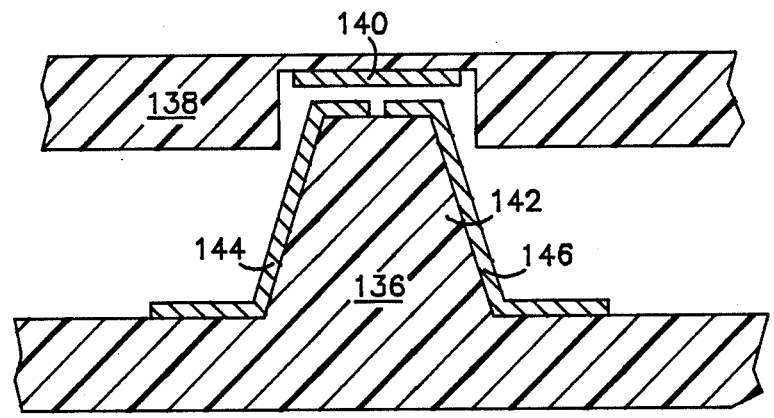
FIG. 2 is a cross-sectional view illustrating the integral switch, as seen along line 2—2 of FIG. 1.

Housing 100 also includes an integrally molded switch, which is illustrated in cross-section in FIG. 2 (in FIG. 2, housing 100 is illustrated fully assembled with cover 104 attached to base 102). Referring to FIGS. 1 and 2, switch 136 includes a thin, flexible wall 138 onto which a first printed circuit switch contact 140 is directly disposed. The diameter of flexible wall 138 is approximately 10 millimeters and the thickness of the wall is approximately 125 microns. Cover 104 includes an integrally molded pillar 142 on its interior surface onto which two printed circuit switch contacts 144 and 146 are directly disposed. To facilitate the photolithographic definition of printed circuit switch contacts 144 and 146, pillar 142 is partially conical in shape with sloping side walls that form an angle of approximately 70 degrees with the interior surface 104A of the cover. In operation, pressure is applied to the exterior surface of flexible wall 138 causing it to deflect towards pillar 142, whereupon switch contact 140 shorts contact 144 to contact 146.

A slideable battery compartment 148 includes an aperture 148A suitable for receiving a thin, disc shaped battery (the battery is not illustrated in FIG. 1). battery compartment 148 slides into housing 100C through an aperture 150 in peripheral wall 108, whereupon one of the battery's terminals contacts battery contact 152 on the interior of base member 102. Battery contact 152 is connected to printed circuit pattern 112. In the alternative, the battery can be mounted internally (i.e., without the benefit of slideable battery compartment 148) by retaining the battery within an arcuate wall 156, which completes slightly more than 180 degrees of a circle.

Figure 3:
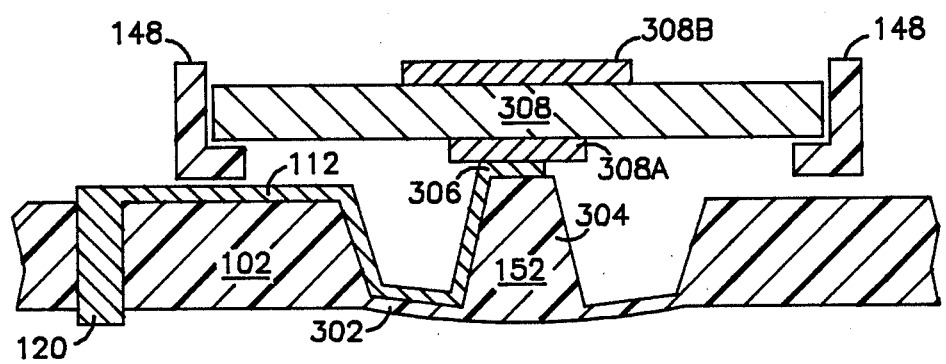
FIG. 3 is a cross-sectional view illustrating the battery contact, as seen along line 3—3 of FIG. 1.

In FIG. 3, a detailed cross-sectional view of battery contact 152 is illustrated. Referring to this figure, battery contact 152 includes a thin flexible wall 302 with a protuberance 304 attached to the thin wall. Thin wall 302 and protuberance 304 are preferrably integrally molded with base member 102. A printed circuit battery contact 306 is directly disposed on the upper surface of protuberance 304 and is electrically connected to the printed circuit pattern 112 on the interior surface of the base. When a battery is installed in in housing 100 (either directly, or through the use of a battery compartment 148), printed circuit battery contact 306 is forcibly engaged with the battery terminal 308A on the battery, causing thin wall 302 to flex downward and apply pressure on terminal 308A. A similar battery contact 154 (see FIG. 1) is located on the interior of cover 104, but is not illustrated in FIG. 3. Battery contact 154 applys a force to a second battery terminal 308B, equal in magnitude but opposite in direction to the force exerted on battery terminal 308A by battery contact 152. Thin wall 302 and protuberance 304 are similar in design to wall 138 and pillar 142 of switch 136.

A liquid crystal display (LCD) 158 is positioned in an aperture 160 in the base. Electrical contacts, e.g. 158A, on the LCD are connected to contacts, e.g. 112A, by the use of a well known heat seal connector, such as those available from Nipon Graphite Industries. When housing 100 includes LCD 158, mylar sheet 132 requires a transparent window centered over the viewing surface of the LCD.

Figure 4:
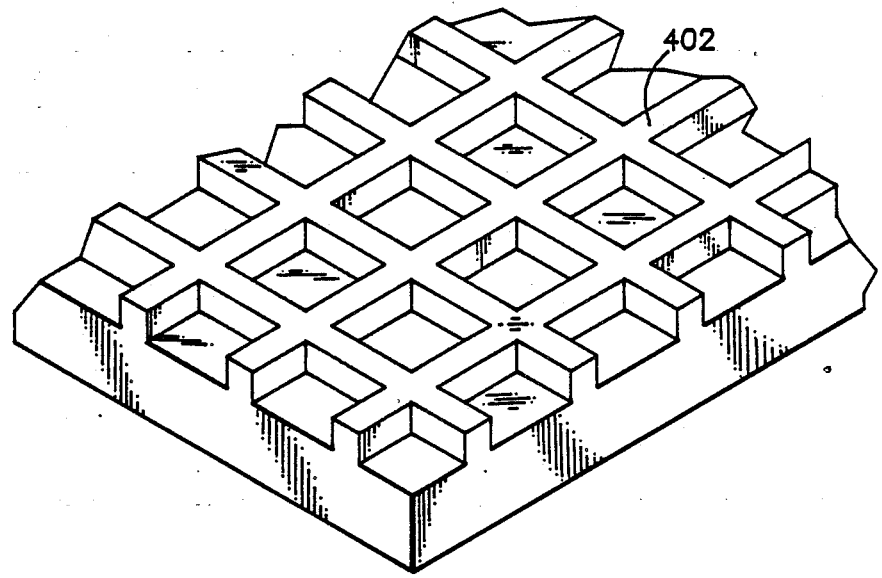
FIG. 4 is a partial perspective view of the housing base illustrating an optional integrally molded structural reinforcing means. The exterior surface of the housing base faces "up" in the figure.
Figure 5:
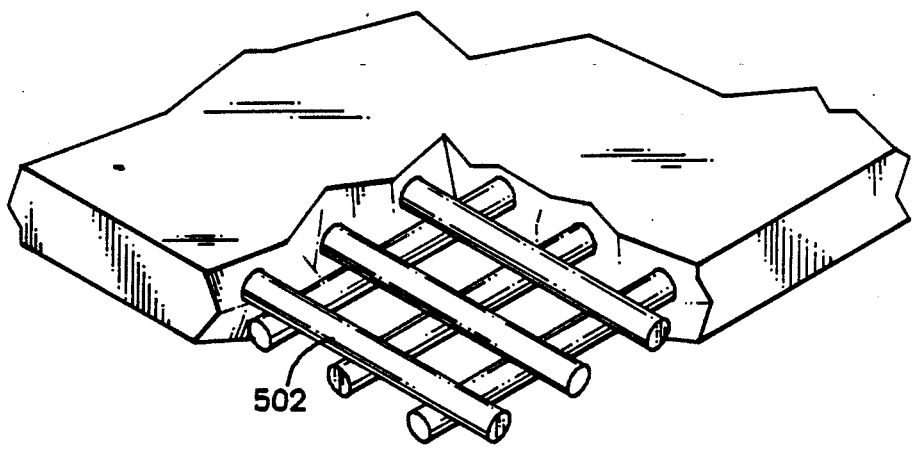
FIG. 5 is a partial perspective view of the housing base illustrating an optional integrally molded reinforcing bar structure.

To strengthen base and cover members 102 and 104, an integrally molded structure 402, such as the one illustrated in FIG. 4, can be used on the external surface of the member (this precludes, however, the use of a printed circuit pattern on the exterior surface). In the alternative, a pattern of reinforcing rods 502, such as the one illustrated in FIG. 5, can be integrally molded into the base and cover members.

Other shapes of moldable/foldable housings, besides the one illustrated in FIG. 1, are also possible, and the invention can be practiced with more than two flexibly interconnected housing members (i.e., base 102 and cover 104). For example, hinged sides could be substituted for the rigid peripheral wall 108, and flat, printed circuit substrates (also integrally molded with the housing) could be flexibly attached to one of the housing members and folded into the housing cavity (the space between surfaces 102A and 104A) at final assembly, but after electronic components have been attached to these additional hinged substrates.

We claim as our invention:

1. A moldable/foldable housing for an electronic device comprising in combination:
   first and second housing members and a hinge joining said housing members, said housing members and said hinge being integrally molded;
   a first solderable printed circuit pattern disposed directly on a first surface of said first housing member;
   a second printed circuit pattern disposed on a second surface of said first housing member, said second surface opposing said first surface; and
   a conductive through-hole connected between said first and second printed circuit patterns.

2. The moldable/foldable housing of claim 1, wherein said second surface of said first housing member includes an exterior surface of said housing, and said housing includes an insulating sheet disposed over said second printed circuit pattern.

3. A moldable/foldable housing for an electronic device comprising in combination:
   first and second housing members and a hinge joining said housing members, said housing members and said hinge being integrally molded;
   a first solderable printed circuit pattern disposed directly on a first surface of said first housing member; and
   a switch, integrally formed with said housing, said switch including:
   a thin, flexible wall integrally molded into said first housing member;
   a first printed circuit switch contact disposed directly on a surface of said thin wall;

a second printed circuit switch contact disposed directly on said second housing member.

4. A moldable/foldable housing for an electronic device comprising in combination:
   first and second housing members and a hinge joining said housing members, said housing members and said hinge being integrally molded;
   a first solderable printed circuit pattern disposed directly on a first surface of said first housing member;
   structural means, integrally molded with said housing, for strengthening said housing member, said structural means including reinforcing rods molded into said housing.

5. A moldable/foldable housing for an electronic device comprising in combination:
   first and second housing members and a hinge joining said housing members, said housing members and said hinge being integrally molded;
   a first solderable printed circuit pattern disposed directly on a first surface of said first housing member; and
   a battery contact, said battery contact including:
   a thin, flexible wall integrally molded in said first housing member;
   a protuberance attached to said thin wall;
   a printed circuit battery contact disposed on said protuberance;
   said housing being constructed and arranged such that when a battery in installed in said housing, said printed circuit battery contact is forcibly engaged with a terminal on said battery, causing said thin wall to flex.

6. A moldable/foldable housing for an electronic device comprising in combination:
   first and second housing members and a hinge joining said housing members, said housing members and said hinge being integrally molded from a thermoplastic material;
   a first solderable printed circuit pattern vacuum deposited on a first surface of said first housing member;
   a second solderable printed circuit pattern vacuum deposited on a second surface of said first housing member, said second surface opposing said first surface; and
   a conductive through-hole connected between said first and second printed circuit patterns.

7. The moldable/foldable housing in claim 6, wherein said second surface of said first housing member includes an exterior surface of said housing, and said housing includes an insulating sheet disposed over said second printed circuit pattern.

8. A moldable/foldable housing for an electronic device comprising in combination:
   first and second housing members and a hinge joining said housing members, said housing members and said hinge being integrally molded from a thermoplastic material;
   a first solderable printed circuit pattern vacuum deposited on a first surface of said first housing member; and
   a switch, integrally formed with said housing, said switch including;
   a thin, flexible wall integrally molded into said first housing member;
   a first printed circuit switch contact vacuum deposited on a surface of said thin wall; and
   a second printed circuit switch contact vacuum deposited on said second housing member;

9. A moldable/foldable housing for an electronic device, comprising in combination:
   first and second housing members and a hinge joining said housing members, said housing members and said hinge being integrally molded from a thermosplastic material;
   a first solderable printed circuit pattern vacuum deposited on a first surface of said first housing member; and
   structural means, integrally molded with said housing, for strengthening said housing member, the structural means including reinforcing rods molded into said housing.

10. A moldable/foldable housing for an electronic device comprising in combination:
    first and second housing members and a hinge joining said housing members, said housing members and said hinge being integrally molded from a thermoplastic material;
    a first solderable printed circuit pattern vacuum deposited on a first surface of said first housing member; and
    a battery contact, said battery contact including:
    a thin, flexible wall integrally molded in said first housing member;
    a protuberance attached to said thin wall; and
    a printed circuit battery contact vacuum deposited on said protuberance;
    said housing being constructed and arranged such that when a battery is installed in said housing, said printed circuit battery contact is forcibly engaged with a mating contact on said battery, causing said thin wall to flex.

11. A moldable/foldable housing for an electronic device, comprisinq in combination:
    first and second housing members and a hinge joining said housing members, said housing members and said hinge being integrally molded from a thermoplastic material;
    first and second solderable printed circuit patterns vacuum deposited on opposing surfaces of said first housing member;
    conductive through-holes connected between said first and second printed circuit patterns;
    a third solderable printed circuit pattern vacuum deposited on a surface of said second housing member;
    an interconnecting printed circuit pattern vacuum deposited on said hinge and connected between said first and third printed circuit patterns.

12. The moldable/foldable housing of claim 11, further comprising a switch, said switch including:
    a thin, flexible wall integrally molded into said first housing member;
    a first printed circuit switch contact vacuum deposited on a surface of said flexible wall; and
    a second printed circuit switch contact vacuum deposited on said second housing member.

13. The moldable/foldable housing of claim 11, further comprising a battery contact, said battery contact including:
    a thin, flexible wall integrally molded in said first housing member;
    a protuberance attached to said thin wall; and
    a printed circuit battery contact vacuum deposited on said protuberance;
    said housing being constructed and arranged such that when a battery is installed in said housing, said printed circuit battery contact is forcibly engaged with a terminal on said battery, causing said thin wall to flex.

* * * * *